(12) United States Patent
Delmastro et al.

(10) Patent No.: US 12,710,464 B2
(45) Date of Patent: Aug. 18, 2026

(54) FAULT DETECTION METHOD

(71) Applicant: DAC SYSTEM SA, Manno (CH)

(72) Inventors: Paolo Delmastro, Lainate (IT); Riccardo Maggiora, San Salvatore Monferrato (IT); Sara Marina Salvador, Rosta (IT)

(73) Assignee: DAC System SA, Manno (CH)

( * ) Notice: Subject to any disclaimer, the term of this patent is extended or adjusted under 35 U.S.C. 154(b) by 0 days.

(21) Appl. No.: 18/774,850

(22) Filed: Jul. 16, 2024

(65) Prior Publication Data

US 2024/0369610 A1 Nov. 7, 2024

Related U.S. Application Data

(63) Continuation of application No. 17/286,346, filed as application No. PCT/IB2019/058846 on Oct. 17, 2019, now Pat. No. 12,066,478.

(30) Foreign Application Priority Data

Oct. 22, 2018 (CH) ................................ CH01284/18

(51) Int. Cl.
*G01R 31/11* (2006.01)
*H04B 3/46* (2015.01)
*H04L 27/18* (2006.01)

(52) U.S. Cl.
CPC ............... *G01R 31/11* (2013.01); *H04B 3/46* (2013.01); *H04L 27/18* (2013.01)

(58) Field of Classification Search
CPC ........ G01R 31/00; G01R 31/08; G01R 31/11; H04B 3/00; H04B 3/02; H04B 3/46; H04B 3/462; H04L 27/00; H04L 27/18
USPC ......................... 324/500, 512, 527, 532, 533
See application file for complete search history.

(56) References Cited

U.S. PATENT DOCUMENTS 4,021,731 A 5/1977 Alsberg
4,224,622 A * 9/1980 Schmidt .................... G01S 7/36 342/149
7,165,200 B2 1/2007 Jani et al.
7,940,061 B2 5/2011 Focia et al.
12,066,478 B2 * 8/2024 Delmastro .............. H04L 27/18
2006/0039449 A1 2/2006 Fontana et al.
2011/0313691 A1 12/2011 Kurt et al.

FOREIGN PATENT DOCUMENTS

CN 103630943 B * 11/2014 ........... G01S 13/885
CN 104660304 A 5/2015
EP 4333388 A2 * 3/2024 ............... H04B 3/46
(Continued)

OTHER PUBLICATIONS

International Search Report and Written Opinion received for PCT Patent Application No. PCT/IB2019/058846, mailed on Dec. 13, 2019, 6 pages.

*Primary Examiner* — Hoai-An D. Nguyen
(74) *Attorney, Agent, or Firm* — BLANK ROME LLP

(57) ABSTRACT

A device for testing faults and non-conformities in a waveguide, in a radio transmitting system comprising a transmitter connected to an antenna by a waveguide, a coaxial cable or a coaxial line. The device is arranged for injecting a signal in the waveguide and for receiving a backscattered signal, characterizing a nonconformity or a fault. The injected signal may be a digital UWB signal.

9 Claims, 4 Drawing Sheets

(56) References Cited

FOREIGN PATENT DOCUMENTS

| | | | |
|---|---|---|---|
| JP | 2005501262 | A | 1/2005 |
| JP | 2016045211 | A | 4/2016 |
| JP | 2017096774 | A | 6/2017 |
| WO | 0057571 | A1 | 9/2000 |
| WO | 2004091105 | A2 | 10/2004 |
| WO | 346246 | B1 | 5/2022 |

* cited by examiner

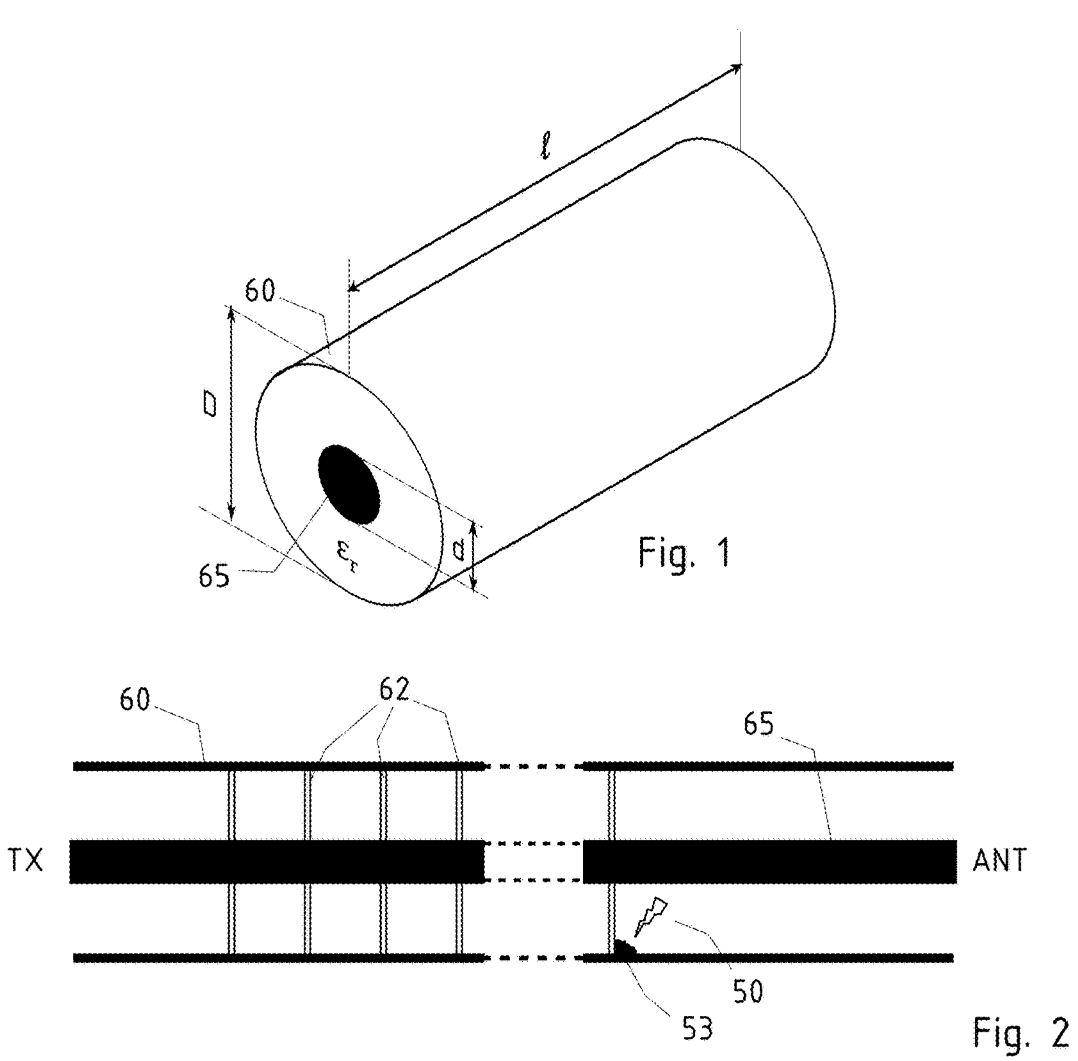
Fig. 1
60
62
65
TX
ANT
50
53
Fig. 2
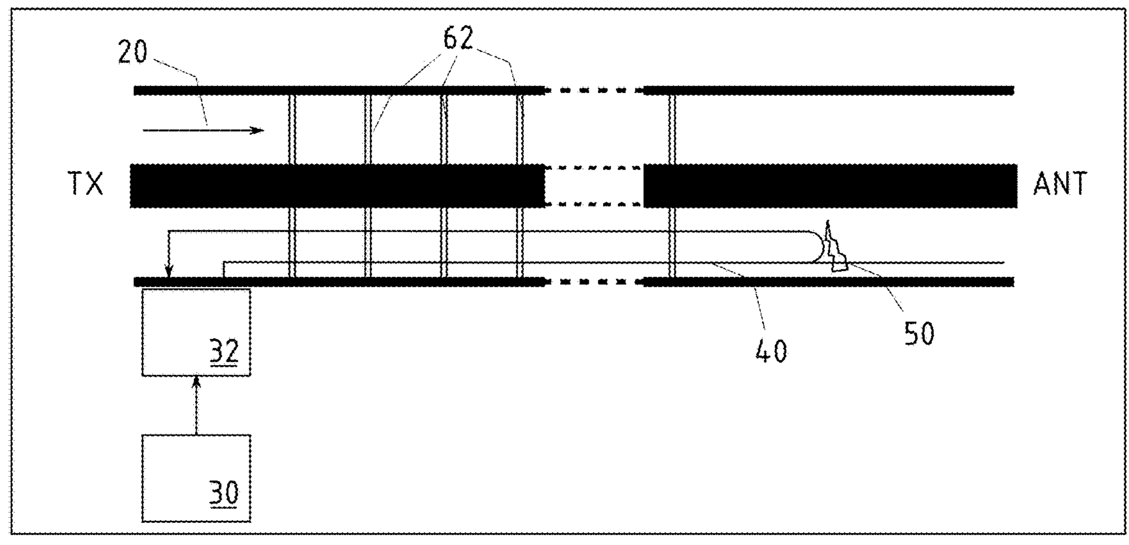
Fig. 3

FAULT DETECTION METHOD

REFERENCE DATA

The present application is a continuation of U.S. patent application Ser. No. 17/286,346, which is a national phase of international patent application PCT/IB2019/058846 of Oct. 17, 2019 claiming priority of Swiss patent application CH 01284/18 of Oct. 22, 2018.

FIELD OF THE INVENTION

The present invention concerns a system able to detect and localize sparks and degradations in coaxial transmission lines.

RELATED ART

The present system applies, among others, to transmitting or transmitting/receiving system based on a signal generator (transmitter, with or without a receiver) connected to an antenna by means of a coaxial transmission line. The invention can be usefully applied to the monitoring and diagnostics of broadcasting stations and transmitters in mobile data networks, including:

- Transmitting stations for FM analogic Radio Broadcast;
- Transmitting stations for Digital Radio Broadcast (DAB);
- Transmitting stations for Digital TV Broadcast in any standard (DVBT, ATSC and all future evolutions);
- Mobile telecommunication networks.

As illustrated in FIG. 1, a coaxial transmission line is generically a pair of cylindrical conductors with the same axis and different diameters, where the space between the conductors is filled by a dielectric material characterized by a dielectric constant $\epsilon_r$.

Generically, the signal transported by the line, will be referred to as "Service".

Transmission lines can have several different characteristics depending from the application. The electromagnetic characteristics of the transmission line are determined, as it is known, by the inner and outer diameters, "d" and "D" as well as the dielectric constant $\epsilon_r$. "$\ell$" stands for the length of the coaxial cable.

The following disclosure will refer to a generic coaxial structure but are applicable to any kind of coaxial line, from flexible cables filled with any kind of dielectric, solid or gaseous. Cables used in broadcast tower must handle very high power levels and are, often, rigid coaxial filled with air, with and without pressurization. The alignment between the inner conductor and the outer one is assured by suitable spacers 62, for example in the shape of PTFE (Teflon®) discs, as shown in FIG. 2.

In wireless transmission systems based on coaxial transmission lines, two physical phenomena can cause malfunction of the system or even safety risks for the operators: sparks (dielectric discharge) in the coaxial cable/line and degradation (up to failure) of the coaxial cable/line.

SPARKS

Every coaxial line presents a breakdown threshold, i.e. a maximum value of potential difference between the two conductors of the line that can be applied without causing a dielectric breakdown (and consequent dielectric discharge).

The maximum voltage applicable to the inner conductor depends from the geometrical dimensions of the lines and the dielectric material filling the line. In presence of a radiofrequency signal with a peak power high enough to overcome the voltage threshold, a breakdown will occur in the dielectric, creating an arc and discharging the energy of the signal on the external conductor of the line, usually connected to ground. In general, the design of the transmission line considers the maximum peak power expected to flow in the line, and the line size is dimensioned with proper margins in order to avoid exceeding the threshold and causing a dielectric discharge. Nevertheless, several factors may affect the performance of the system, reducing the breakdown threshold and/or increasing the peak voltage applied to the inner conductor because of the introduction of reflections that can cause stationary waves in the line.

As illustrated in FIG. 2, examples of these factors are:

- Deformation of the conductors due to excessive mechanical stress with consequent loss of cylindrical symmetry;
- Deformation of the conductors and/or the plastic (usually Teflon®) parts in the line due to aging and thermal cycles;
- Defects in the construction of the mechanical parts;
- Accidental damages during maintenance operations;
- Damages caused by animals (mice, birds) in the station;
- Human mistakes in the mounting during the installation;
- Presence of humidity, dust, unwanted material inside the line.

Sparking is accompanied by a high current flowing in the dielectric of the line, discharging a high energy in a very short time on the metal (usually copper) walls. The effect may cause permanent damages to the metal walls of the line, causing in the long term a loss of performance and even a physical destruction, with potentially dangerous consequences in high power systems (total system failure, fires, explosion).

DEGRADATION/FAILURE

The same causes listed as example in the previous section, if not causing a breakdown, may cause other effects on the behaviour of the transmission line. Accidental damages in invisible positions (rodents, for example) can cause total failure that can be hard to localize in a long transmission line running in a complex infrastructure. Small deformations, little quantities of unwanted materials, small imperfection in the installation may be invisible in the short term and have too small effects to enable a spark. Nevertheless, it is still possible a local degradation of the performance that, for example, causes a localized effect that from the electrical point of view may be regarded as a parasitic resistance in series with the line. The resistance will therefore dissipate an unwanted amount of power in the form of heat. In time, this spurious heat dissipation can cause a localized overheating and in the worst cases reach the melting point for the plastic parts, causing a sudden and potentially destructive failure.

The two problems described in the previous section are currently faced with different methods.

Current solutions for the detection of the sparks are based on given physical effects of the spark, namely on:

- Acoustic effects. The generation of an arc in the line in facts causes a typical "click" that can be detected by a specific sensor in the line.
- Electromagnetic emissions outband. In presence of a spark, a big amount of energy is transferred from across the arc leading to an emission of radiations in many frequency bands. Detecting an emission in a frequency outside the range occupied by the TV/Radio signal would be indicator of the presence of a spark.

However, these solutions may be effective to detect a presence of a spark in the line, but none of them is able to localize the exact position of the spark within a line.

TDR techniques are widely used for the cable fault localization. The principle of TDR is that on one end of the cable a test signal is transmitted, being it a wideband pulse, the echo is listened, and a time delay is measured incoherently. These techniques allow to detect discontinuities in the cables with low spatial resolution and amplitude accuracy.

However, currently available TDR instruments cannot provide a fault localization while the cable is operating, i.e. providing a service signal (TV or Radio in our case). To apply the instruments, it is necessary to stop the service, disconnect the transmitter and connect the instrument.

BRIEF SUMMARY OF THE INVENTION

An aim of the invention is to provide a device for detecting a factor causing a spark and/or degradation (failure) of a coaxial cable or line that is exempt of, or at least mitigates, the limitations of knowns devices.

A particular aim of the invention is to provide a detecting device capable to operate while the coaxial cable or line is operating.

Another aim of the invention is to provide a detecting device capable to provide a more accurate position of the factor and/or of the spark/arc in the coaxial cable or line.

According to the invention, these aims are achieved by means of the device of claim 1. Dependent claims relate to special embodiment of the invention.

The proposed solution provides, in particular:

- a coexistence of the injected signal with the TV/Radio signal (in-service measurements) transmitted by means of the monitored coaxial cable/line;
- a high resolution in space and high accuracy in amplitude thanks to the coherent receiver
- a detection of small and fast variations of the behaviour (e.g. technical features) of the monitored coaxial cable/line.

BRIEF DESCRIPTION OF THE DRAWINGS

The invention will be better understood with the aid of the description of an embodiment given by way of example and illustrated by the figures, in which:

FIG. 1 shows a view of a coaxial transmission line;

FIG. 2 shows a schematically view of a spark generated inside a coaxial transmission line with an arc and a defect along the line;

FIGS. 3 and 4 schematically show a detection of a presence and a position of an arc in a coaxial cable/line, and, respectively, a deviation of the distribution of the reflections along the line;

DETAILED DESCRIPTION OF POSSIBLE EMBODIMENTS OF THE INVENTION

FIGS. 1 and 2 show a typical rigid coaxial transmission line, as those used in radio and television broadcast towers for VHF and UHF signals. The invention is particularly suited for monitoring such installations but is not limited thereto and could be used to determine faults in any possible transmission line. Since the detection system of the invention relies on ultra-wide bandwidth emissions, it can be used successfully in a large variety of transmission lines.

The proposed detection system (device) consists of a guided radar, that is a radar signal propagating inside the transmission line. The system generates a train of radar pulses at a carrier frequency outside the range of the service signal, in order to avoid introducing any disturbance.

Figure 4:
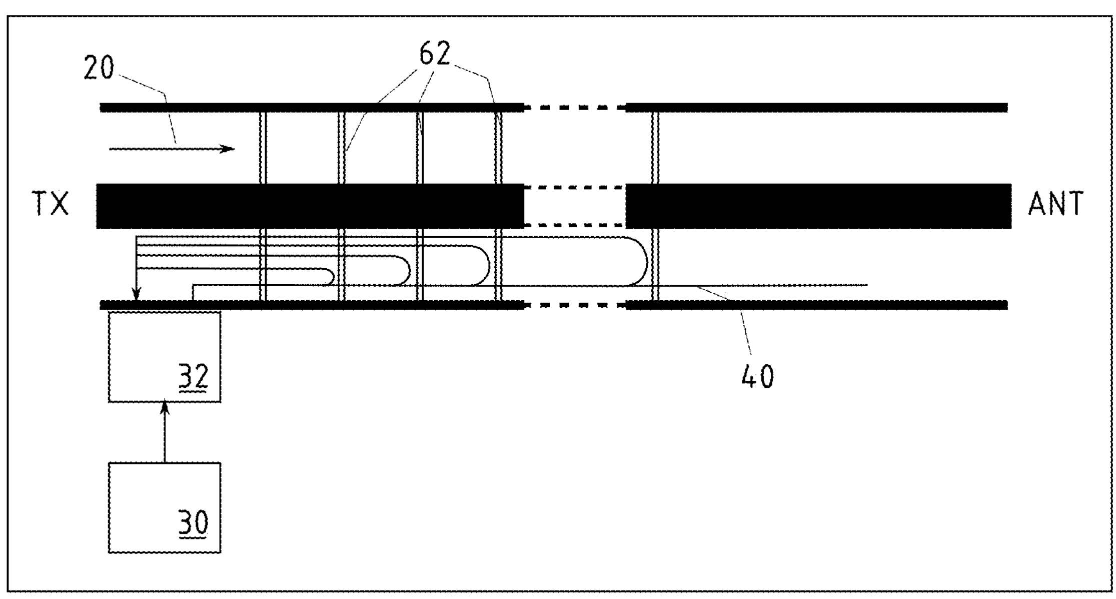

The system comprises a transmitter configured to emit a radar signal in a predetermined direction inside the transmission line (waveguide, such as a coaxial cable or a coaxial line) and a radar receiver configured to capture scattered radar signal, i.e. radar signal being reflected towards the transmitter). The transmitter and the receiver can operate (substantially) at a same position along the transmission line and be enclosed in a combined radar device 30 capable of transmitting and receiving. A suitable radar coupler 32 (as illustrated in FIGS. 3 and 4) is used to launch the signal in the transmission line, for example at the end of the cable close to the transmitter and farther from the antenna, together with the service 20.

The predetermined transmission direction is preferably substantially parallel to the longitudinal axis of the transmission line (e.g. the axis of the pair of cylindrical conductors), notably (at least) at the operating position of the transmitter.

In a preferred embodiment the used radar signal is an Ultra-wideband (UWB) radar signal. The UWB radar signal is characterized by an antenna transmission for which emitted signal bandwidth exceeds the lesser of 500 MHz or 20% of the arithmetic carrier frequency, as defined by the International Telecommunication Union (ITU) in recommendation ITU-R SM.1755-0.

Unlike other source, including several spread spectrum radio signal, UWB radio signal provide no (or at least unperceivable) interferences with conventional narrowband and carrier wave transmission in the same frequency band, as the UWB radar signal is spread over a larger band.

For example, for transmission systems operating in UHF range (e.g. 470-800 MHz) or in FM range (e.g. 88-108 MHz), the radar signal is modulated on a carrier centred at 250 MHz, with a bandwidth in a range of 125 MHz, thus with a fractional bandwidth of 0.5, well above the limit in the above-mentioned definition.

The UWBR is generating very short pulses (in the range of less than 10 ns duration). The short duration of the pulses is generating the wide bandwidth, unlike other spread spectrum techniques, where the wide band is consequence of specific techniques in time or frequency domain, aiming to spread the energy of the signal over the spectrum. The duration and repetition period of the radar signals will be much smaller than the typical spark duration. The amplitude of the radar signals is kept low enough compared to the carrier power of the service signal 20, in order to not exceed out-band emission limits.

The signal generated by the radar system will be injected into the transmission line by means of coupler 32, that will be substantially transparent to the propagation of the service signal 20 from the transmitter to the antenna and will allow to couple the radar frequency with the transmission line. Pulses propagate in the coaxial line and reflections (echoes) are generated by any discontinuity in the line. Discontinuities may be mechanical (plastic elements, deformations, curves, etc) or electrical. The presence of an arc in the line due to a dielectric breakdown is a strong electrical discontinuity, being it comparable with a very small resistance connecting the two conductors of the line (almost a short circuit).

FIG. 3 illustrates a possible propagation of the radar signal in a transmission line. The radar device 30 launches a signal in the transmission line from the transmitter's end (TX) towards the antenna (ANT). At each discontinuity in the line, part of the signal is reflected and returns to the radar coupler 32 (arrow 40). The echoes (backscattered signal) received after each pulse are analysed, preferably in real time, by radar device 30, and two information are extracted: presence and position of arcs (50) in the line (cf. FIG. 3), where the position can be calculated knowing the TOF (Time of Flight), that is the delay of the echo, since the propagation speed in the line is known and depends from the dielectric constant of the material filling the line.

FIG. 4 shows a radar signal that propagates along the line and generate a plurality of echoes, each echo being reflected by a specific discontinuity. In this example, the discontinuities generating the return signals are the spacer discs 62 but any other discontinuity, including contaminations, extraneous bodies, defective contacts, sharp bends and so on, will generate a signature echo in the backscattered signal that allows to identify degradations of the health status of the line due to any of the causes listed in the previous section.

Every pulse will generate a complex echo, resulting from the compositions of echoes from each discontinuity in the line. The resulting signal can be plotted to represent the reflection level as function of distance from the radar transmitter. Preferably, the return echo is compared to a baseline signal representing the ideal behaviour of the line.

Figure 5:
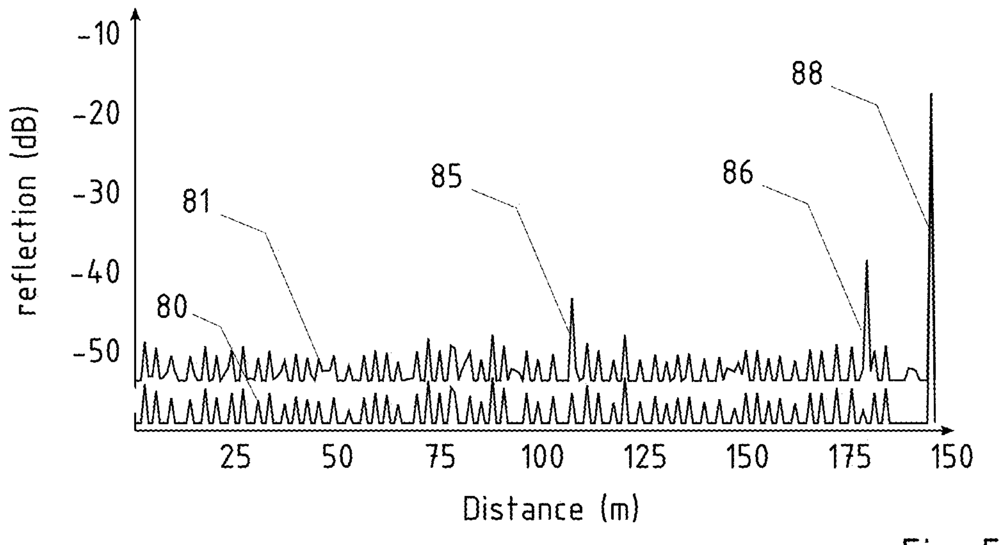
FIG. 5 shows an exemplary comparison between reflected signal and a baseline signal (representing an ideal behavior of the coaxial cable or line).

FIG. 5 is a plot of a reference signal 80 and of a possible echo signal obtained from a transmission line 81, the reference signal 80 is artificially shifted downwards for the clarity of comparison. The horizontal axis is a time axis but, since the propagation speed of the signals in the transmission line is known, the time is expressed as a distance. Reference signal 80 presents a plurality of low-level peaks that may stand from the unavoidable reflections from the spacer insulators 62, and a final peak 88 that indicates the reflection from the antenna. The comparison of signal 81 with the reference signal 80 indicates two positions 85 and 86 that generate an echo significantly stronger than the reference. These positions can be determined accurately from the time delay of the corresponding echoes.

To calculate with high accuracy the TOF of the echoes, a correlation algorithm is adopted. The received signal is demodulated to extract the original binary information and the result will be given by the sum of all the scattered signals travelling back to the radar source. Given a transmitted signal:

$$TX=s(t)$$

the received signal will be:

$$RX = \sum_i \Gamma_i s(t-\tau_i)$$

where $\tau_i$ and $\Gamma_i$ are respectively the delays and the reflection coefficients of the signals scattered by all the discontinuities in the line.

Correlating the two signals, the values of $\tau$ corresponding to the position of the discontinuities will give a peak in the correlation result. In presence of a spark the expected result is a strong variation in the correlation result in correspondence of the position of the spark. This variation will be limited in time. Small degradations due to mechanical effects instead, will be detected in form of small deviations of the correlation results, with a specific increasing trend in time.

DETECTION SYSTEM

The detection system is based on the adoption of a phase-modulated sequence of pulses, which allows for a remarkable increase of the signal energy with respect to a classical pulsed radar, without reducing the time/space resolution associated with short pulses. The phase modulation is obtained by applying a binary sequence, each bit corresponding to a phase shift of 0° or 180°, to a carrier frequency. The core of the real time processing of this application is the correlation between the received signal and the transmitted sequence fundamental to estimate the time of flight of returned echoes.

The amplitude and the time of flight of returned echoes would thus provide a presence of a factor causing a spark and/or a degradation (failure) and a relative position (i.e. a position with respect to the operating position of the transmitter and/or the receiver) thereof.

With a proper sequence design (e.g. binary Golay's code), it is possible to build signals characterized by a very high signal to noise ratio, a good resolution and extremely low side-lobes in the radar response function. Side lobes are directly related to the probability of a wrong result of the correlation algorithm (that is: a wrong estimation of spatial distance of the discontinuity)

PHASE MODULATION

Figure 6:
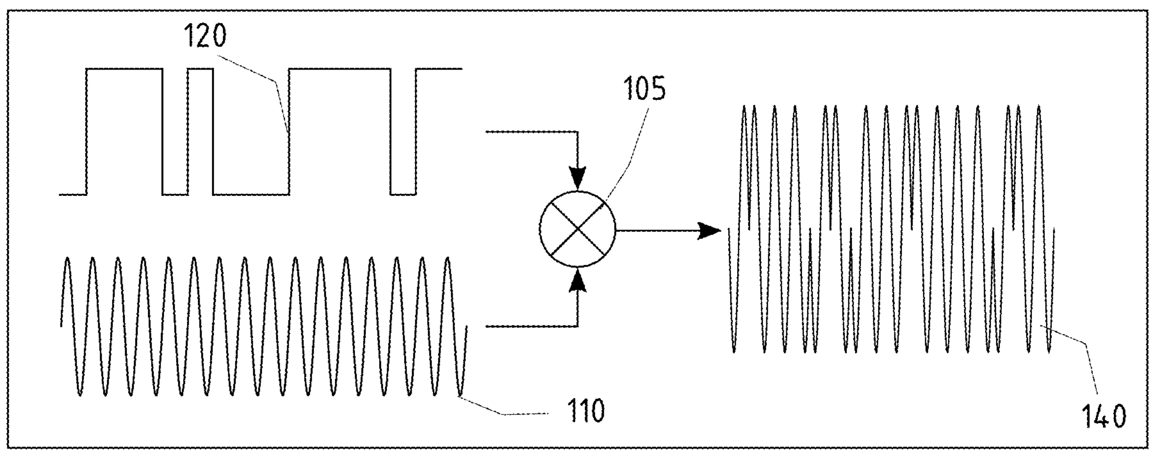
FIG. 6 shows a generation of a modulated signal by modulating (multiplying) a carrier signal with a given binary sequence.

As illustrated in FIG. 6, a sinusoidal carrier 110 at the desired carrier frequency is multiplied by a specific binary sequence 120. The resulting is a 0-180° phased modulated signal 140 that is transmitted to sense the cable.

The multiplier 105 can be realized using Binary phase-shift keying (BPSK).

The specific binary sequence 120 acts as a spreading code and can be a pseudorandom noise code providing a good auto- and cross-correlation properties.

DEMODULATION

Figure 7:
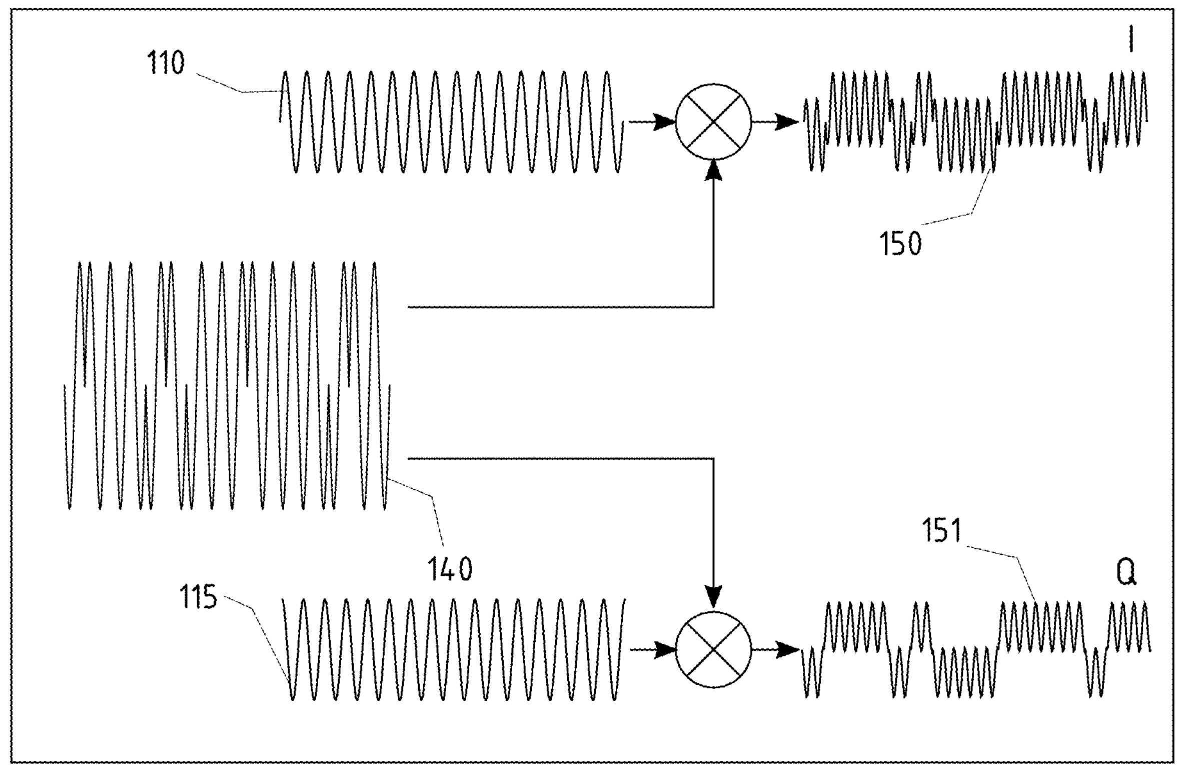
FIG. 7 shows a demodulation of the received signal so to provide an in-phase (I) and an in quadrature (Q) signal.

FIG. 7 illustrates a possible demodulation scheme that could be used, in the frame of the invention, to process the echo signals received from the transmission line. The purpose of this is the extraction of the component of the signal related to the binary sequence, ignoring the high frequency (carrier) part of it.

This initially involves a generation, from the received signal 140 (in radar frequency band) of an in-phase baseband signal 150 (I) and a quadrature baseband signal 151 (Q).

As illustrated in FIG. 7, the received signal 140 is multiplied by the carrier frequency 110 and the carrier frequency with a 90° phase shift 115, to obtain respectively the in-phase baseband signal 150 and in quadrature baseband signal 151.

Figure 8:
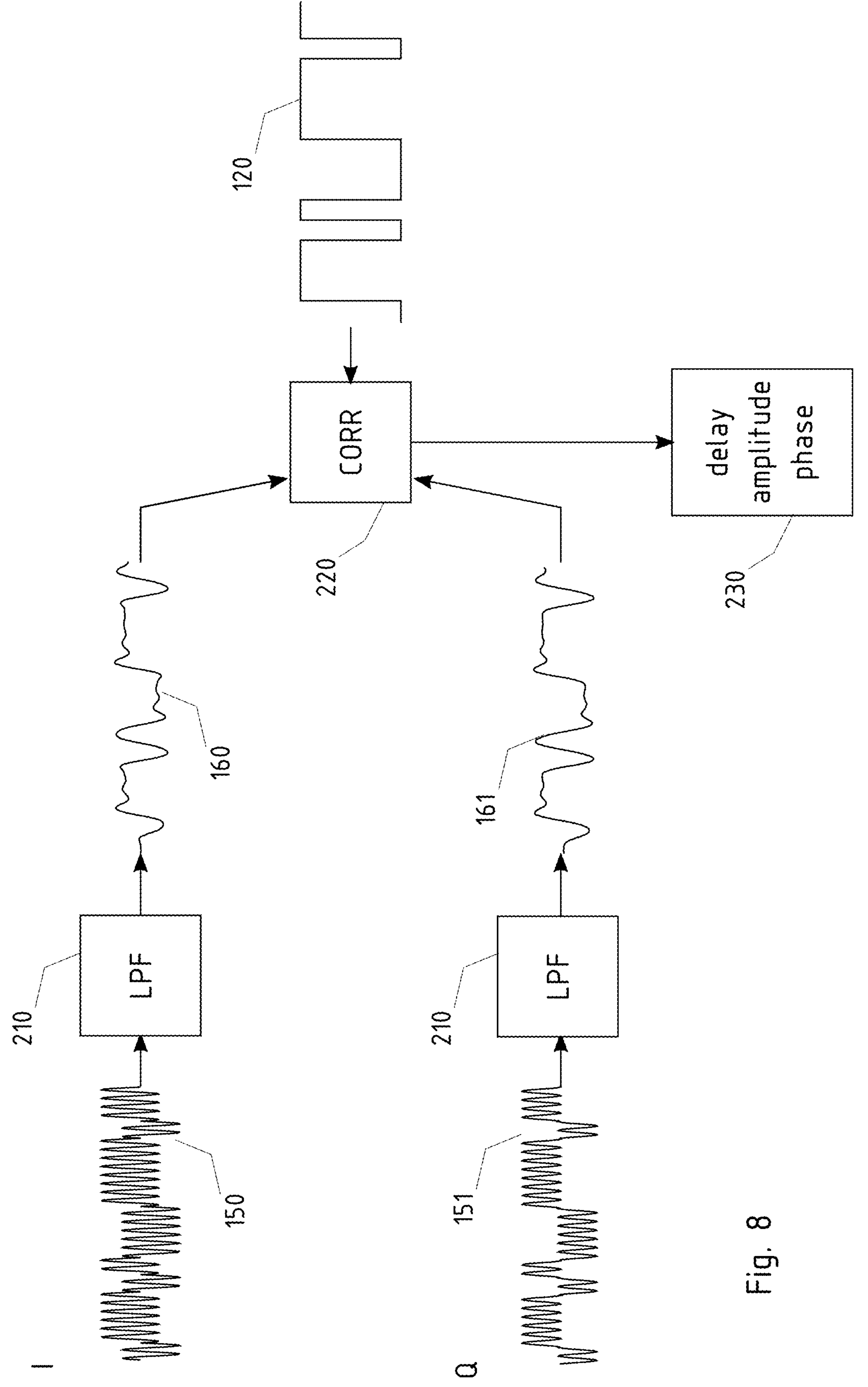
FIG. 8 shows a correlation of the in-phase (I) and in quadrature (Q) signals with the given binary sequence.

As illustrated in FIG. 8, the I and Q signals can be initially filtered by low-pass filter units to remove the high frequency component derived by the demodulation process. The resulting signals are the fed to correlator 220 that correlates them with the binary modulating code 120 to obtain the complex correlation response of the cable that contain all the information on the existing targets (e.g. arcs, damages, etc.).

The applicant surprisingly found that a binary sequence based on forward error correction code, notably on linear error-correcting code (e.g. binary Golay's code) provides a UWB radar signal having auto- and cross-correlation properties providing efficient demodulation.

For example, the binary sequence can be obtained by generating a pseudorandom binary sequence and then by applying on this pseudorandom binary sequence a forward error correction code, notably a linear error-correcting code (e.g. binary Golay's code).

REFERENCE NUMBERS

20 service
30 guided radar
32 coupler
40 signal path
50 spark
53 defect/contamination/failure point
60 outer conductor
62 dielectric discs/spacers
65 central conductor
80 baseline measurement
81 current measurement
85 degradation at 109 m
86 degradation at 182 m
88 reflection from the antenna
105 multiplier
110 carrier
115 carrier with 90° phase shift
120 modulating binary sequence
140 modulated signal
150 in-phase baseband signal
151 quadrature baseband signal
160 in-phase filtered signal
161 quadrature filtered signal
210 low-pass filter
220 correlator
230 target response

The invention claimed is:

1. A device for testing faults and non-conformities in a waveguide connecting a transmitter to a radio antenna in a transmitting or transmitting/receiving radio system, comprising:

a radar transmitter for generating a radar signal;

a coupler for receiving the radar signal from the radar transmitter and injecting the radar signal in the waveguide, superposed to a service signal transmitted by means of the waveguide;

a receiver for receiving a backscattered signal; and a detection apparatus for determining presence and position of discontinuities in the waveguide based on the backscattered signal.

2. The device of claim 1, wherein the injected radar signal is a modulated BPSK signal.

3. The device of claim 2, the transmitter being configured to generate the modulated BPSK signal by multiplying and/or modulating a given binary sequence with a carrier frequency in the transmitter.

4. The device of claim 3, wherein the receiver is configured to generate of a base-band backscattered signal from said backscattered signal.

5. The device of claim 3, the receiver being further configured to correlate a copy of said given binary sequence with the received backscattered signal and to provide a Time of Flight of the received backscattered signal.

6. The device of claim 1, wherein the radar signal is an ultra-wide-band radar signal having an arithmetic mean carrier frequency and a bandwidth exceeding the lesser of 500 MHz or 20% of the arithmetic mean carrier frequency.

7. The device of claim 3, wherein said given binary sequence is based on a forward error correction code.

8. The device of claim 1, the service signal being a radio/TV broadcast signal in the UHF range or in the FM range.

9. The device of claim 8, the radar signal comprising short pulses of less than 10 ns duration.

* * * * *